(12) United States Patent
Wang

(10) Patent No.: US 11,785,705 B2
(45) Date of Patent: *Oct. 10, 2023

(54) THERMAL INSULATION AND TEMPERATURE CONTROL OF COMPONENTS

(71) Applicant: Palo Alto Research Center Incorporated, Palo Alto, CA (US)

(72) Inventor: Yunda Wang, Milpitas, CA (US)

(73) Assignee: Xerox Corporation, Norwalk, CT (US)

( * ) Notice: Subject to any disclaimer, the term of this patent is extended or adjusted under 35 U.S.C. 154(b) by 301 days.

This patent is subject to a terminal disclaimer.

(21) Appl. No.: 16/950,691

(22) Filed: Nov. 17, 2020

(65) Prior Publication Data

US 2021/0076484 A1    Mar. 11, 2021

Related U.S. Application Data

(60) Continuation of application No. 16/545,448, filed on Aug. 20, 2019, now Pat. No. 10,917,963, which is a division of application No. 15/682,843, filed on Aug. 22, 2017, now Pat. No. 10,470,292.

(51) Int. Cl.
| | |
|---|---|
| *H03L 1/02* | (2006.01) |
| *H03L 1/04* | (2006.01) |
| *H05K 1/02* | (2006.01) |
| *H05K 7/20* | (2006.01) |

(52) U.S. Cl.
CPC .......... *H05K 1/0212* (2013.01); *H03L 1/028* (2013.01); *H03L 1/04* (2013.01); *H05K 1/0203* (2013.01); *H05K 1/0272* (2013.01); *H05K 7/20218* (2013.01); *H05K 2201/064* (2013.01)

(58) Field of Classification Search
CPC .. H03L 1/028; H03L 1/04; H03L 1/02; H05K 1/0203; H05K 1/0212; H05K 1/0272; H05K 1/02; H05K 2201/064; H05K 7/20218; B23P 19/00; F28F 13/00; H02N 2/00; G01N 27/447; G01N 27/44782
USPC .............................. 174/15.2; 204/601; 331/3
See application file for complete search history.

(56) References Cited

U.S. PATENT DOCUMENTS

| | | | |
|---|---|---|---|
| 6,063,251 A | 5/2000 | Kane et al. | |
| 6,359,275 B1 * | 3/2002 | Bertsch ............... | H01J 49/0404 250/281 |
| 6,364,516 B1 | 4/2002 | Li et al. | |
| 2002/0028308 A1 | 3/2002 | Harada et al. | |
| 2007/0268078 A1 | 11/2007 | Lee | |

(Continued)

FOREIGN PATENT DOCUMENTS

EP         2109222 A2     10/2009

OTHER PUBLICATIONS

Polymer-Metal Conductive Coatings_Bright__pp. 1-3_2013.*
Extended European Search Report dated Dec. 12, 2018 for European Patent Application No. 18187160.9.

*Primary Examiner* — Timothy J Thompson
*Assistant Examiner* — Guillermo J Egoavil
(74) *Attorney, Agent, or Firm* — Womble Bond Dickinson (US) LLP

(57) ABSTRACT

A device may include a temperature controlled chamber. The temperature controlled chamber may be coupled to a plurality of strengthening coated capillary tubes. The strengthening coated capillary tubes may support the temperature controlled chamber and provide thermal insulation to the temperature controlled chamber.

10 Claims, 15 Drawing Sheets

(56) References Cited

U.S. PATENT DOCUMENTS

| | | | |
|---|---|---|---|
| 2010/0164635 A1* | 7/2010 | Kudo | H05K 1/0212 |
| | | | 331/158 |
| 2014/0212609 A1* | 7/2014 | Stratton | H01B 7/046 |
| | | | 385/100 |
| 2014/0292422 A1 | 10/2014 | Kondo | |
| 2016/0014878 A1 | 1/2016 | Kilhenny | |
| 2017/0219301 A1* | 8/2017 | Lin | H02N 2/00 |

* cited by examiner

11,785,705 B2

THERMAL INSULATION AND TEMPERATURE CONTROL OF COMPONENTS

CROSS REFERENCE TO RELATION APPLICATIONS

This application is a continuation of U.S. patent application Ser. No. 16/545,448, filed Aug. 20, 2019, which is a division of U.S. patent application Ser. No. 15/682,843, filed Aug. 22, 2017, now issued as U.S. Pat. No. 10,470,292 on Nov. 5, 2019, the entire contents of which are hereby incorporated by reference.

TECHNICAL FIELD

Implementations of the present disclosure relate to thermal management of electronic components.

BACKGROUND

Some electronic components experience changes to their operation based on changes in temperature. In order to maintain precise operating parameters, such components may be temperature controlled. Controlling the temperature may include the use of one or more heating elements and one or more temperature sensors.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
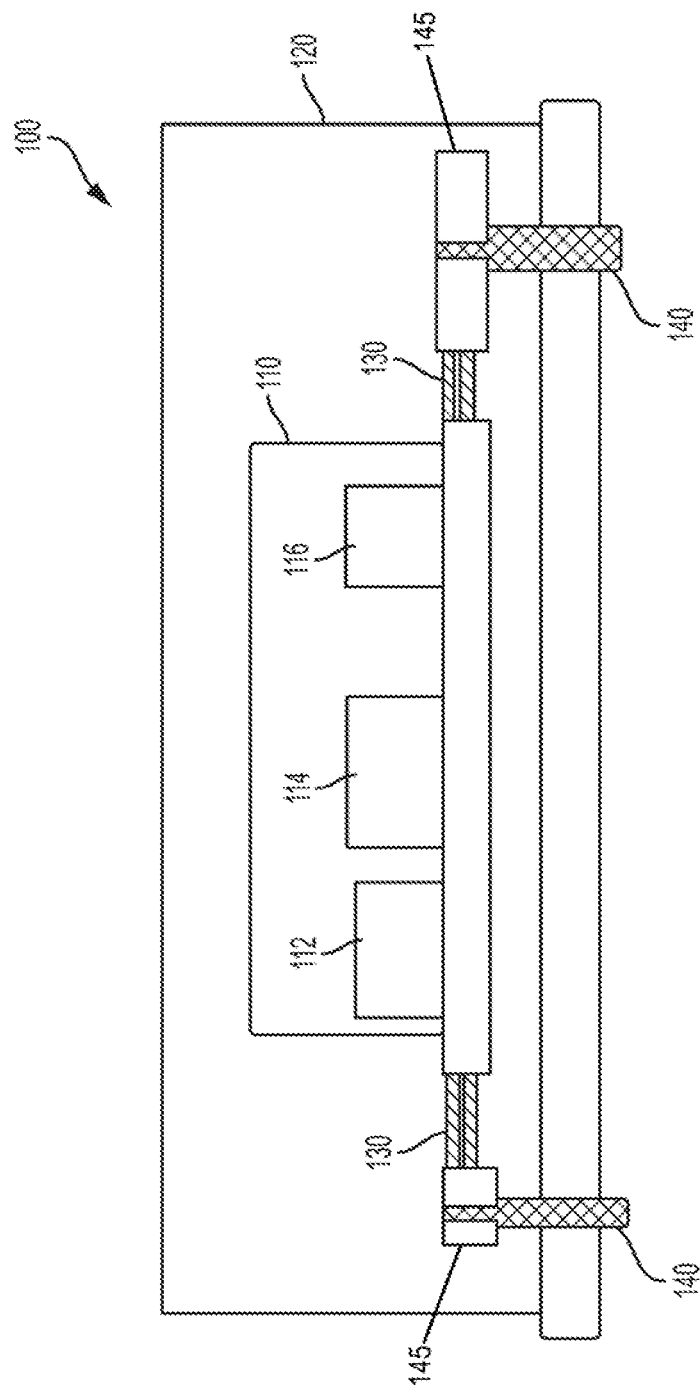
FIG. 1 is a diagram showing an apparatus including a temperature controlled chamber supported by capillary tubes, according to some embodiments.

Certain electronic components change operational characteristics with varying temperatures. In particular applications, controlling the temperature of such components can improve accuracy of the components operation. For example, such components may be contained in a temperature controlled chamber. The temperature of the chamber may be controlled through a heater and a temperature sensor. Controlling the temperature of the temperature controlled component may use a significant amount of power in some applications. In some implementations, a large part of the power consumption may be due to thermal losses between the temperature controlled component and other parts of a system. Therefore, by improving the thermal management of the temperature controlled device, power consumption may be reduced.

An oven-controlled crystal oscillator "OCXO" is a common temperature controlled device. The temperature of the OCXO may be controlled so that the frequency of oscillations provided by the OCXO remain accurate and stable. OCXOs may be used for precise frequency control of radio transmitters, cellular base stations, military communications equipment, and for precision frequency measurement.

There is an increasing demand for crystal oscillators that offer stability without very low power consumption, especially for battery powered devices, such as military and civilian portable radios and other transmitting/receiving devices. Other applications for low power OCXOs include UAVs and drones, low earth orbit (LEO) satellites, guidance systems, phase lock loops, and synthesizers. They can also be used to provide accurate timing and synchronization in devices used where GPS coverage might not be available. Low power OCXO also has applications in high-tech medical equipment, such as magnetic resonance imaging (MRI) machines and other diagnostic imaging tools.

Various OCXOs may have power consumption levels of about 1 W-3 W. Other lower power OCXOs may have power consumption of about 135 mW-180 mW. As discussed above, a cause of the power consumption may be thermal loss from the OCXO to other components of the system. Therefore, a heater in the OCXO may provide additional heat to the system to compensate for the thermal losses. Accordingly, the efficiency and power requirements of an OCXO may be improved by improving the thermal management of the OCXO. In addition, improving the thermal management of an OCXO may shorten a warmup period for the OCXO. For example, in some OCXOs, it may take approximately 1 minute to warm the air or material around a crystal to the temperature providing the most stable output. However, by reducing thermal losses around the OCXO, that period may be shortened. For example, in some implementations, the warmup period may be reduced to approximately 10 seconds.

Aspects of this disclosure describe devices, systems, and methods for improving thermal management in a temperature controlled device. In general, many of the embodiments may be described with reference to OCXOs. However, the thermal management components described may also be applied to other temperature controlled devices. Furthermore, the thermal management components may be applied to devices that are not temperature controlled, but that could benefit from thermal isolation from other components of a system.

In some embodiments, components that are to be temperature controlled may be placed inside a temperature controlled chamber. The temperature controlled chamber may be filled with a gas and sealed. In some embodiments, the temperature controlled chamber may be a solid material that has embedded within it the temperature controlled components. For example, a solid material may include an epoxy, polymer, plastic material, glass, or the like. In some embodiments, the temperature controlled chamber may be coated with a low emissivity materials including but not limited to aluminum, silver, copper, gold or pallidum, to reduce the heat loss through thermal radiation from the temperature controlled chamber to its external environment. In some embodiments, the coating thickness varies from several tens of nanometers to several tens of microns.

In some embodiments, capillary tubes may be used as a mechanical supporting structure. The capillary tubes may support the temperature controlled chamber, while thermally insulating the temperature controlled chamber from its external environment. The capillary tubes may also operatively couple the temperature controlled chamber to external components. In some embodiments, the capillary tube may include a tube body material with a hollow core. For example, the capillary tube may be similar structurally to a hollow-core optical fiber. In some embodiments, the tube body may be coated with a strengthening coating to add structural support to the capillary. Thus, the capillary tube may have a strengthening coating layer, a tube body layer, and a core. In some embodiments, the strengthening coating may be a polymeric coating that is to strengthen and protect the tube body material. For example, strengthening coating materials include polyimide, polyamide, parylene, PDMS or the like.

In some embodiments, tube body materials are low thermal conductivity materials. For example, tube body materials may include silica, ceramics, polymers, or the like. In some embodiments, the core is hollow. In some embodiment the core materials are low thermal conductivity materials include but not limited to silica, ceramic, polymers, or the like. In some embodiments, an internal diameter of the tube body may be in the range of about zero to several hundreds of micrometers. In some embodiments, an outer diameter of the capillary tube may be in the range of about seven tens of microns to about several hundreds of microns. A capillary tube structure with a strengthening coating as described above provides strength, non-brittle and durable characteristics to a thin capillary tube. Therefore, the strengthening coated capillary tubes used as mechanical support may be both mechanically robust and a good thermal insulation structure.

In addition to mechanical support, the temperature controlled chamber may be connected with electrical components to other parts of a system. For example, an OCXO may be electrically coupled to components outside the temperature controlled chamber to provide an oscillation signal. The wires to electrically couple temperature controlled components from the temperature controlled components to external components may provide another path for thermal losses. Therefore, providing a low thermal loss path for electrical connection between the thermally controlled components and external components can further reduce power consumption of the temperature controlled components.

In some embodiments, a strengthening coated capillary tube may be coated with a thin film layer that is electrically conductive to provide the electrical connection. For example, the film materials may include copper, gold, silver, conductive epoxy, Indium Tin Oxide, titanium, nickel, or other electrically conductive materials. In some embodiments, there are plural numbers of the thin film layers with at least one layer of electrically conductive materials and other layers for adhesion, protection or other ancillary reasons that helps the engineering of the electrically conductive layer/layers. In some embodiments, an electrically conductive layer may range from about several tens of nanometers to about several micrometers. The coating method of the electrical conductive materials include but not limited to evaporation, sputtering, atomic layer deposition (ALD), Chemical vapor deposition (CVD), spray coating and aerosol jet printing. The electrically conductive layer may therefore provide an electrical connection from the temperature controlled components to external components.

In some embodiments, multiple strengthening coated capillary tubes may be used to support the temperature controlled components. For example, the capillary tubes may be glued or bonded to the temperature controlled chamber using a polymer, epoxy, glue, solder, or silica. In some embodiments, conductive materials are used as the connecting materials for electrical conducting reasons. For example, conductive bonding materials may include silver epoxy or solder. In some embodiments, the connecting joint can have more than one material.

In some embodiments, there are some capillary tubes (principal supporting capillary tubes) physically glued or bonded to the temperature controlled chamber and additional capillary tubes (auxiliary supporting capillary tubes) having point contact to the main supporting capillary tubes. The auxiliary supporting capillary tubes may provide additional mechanical support without adding thermal loss through thermal conduction due to the point contacts between principal supporting capillary and the auxiliary supporting capillary tubes. In some embodiments, the principal supporting capillary tubes and the auxiliary supporting capillary tubes form a mesh.

FIG. 1 is a diagram showing an example embodiment of a system 100 including a temperature controlled chamber supported by strengthening coated capillary tubes. The system 100 includes a temperature controlled chamber 110 and an outer chamber 120. Within the chamber may be a plurality of components that have operations dependent on controlled temperature of the system. In some embodiments, the components may include one or more crystal oscillators 112. The system may also include a temperature 114 that is used to determine a temperature for the system. The temperature controlled chamber 110 may also include a heater 116 to set a temperature for the setting. In some embodiments, the heater 116 may be disposed outside of and in contact with the temperature controlled chamber 110.

In some embodiments, the temperature controlled chamber 110 may be operatively coupled to external electronics through capillary tubes 130. In embodiments, the temperature controlled chamber 110 may be operatively coupled to an external structure 145 by the capillary tubes 130. The temperature controlled chamber 110 may be coated with a low radiation emissivity coating to reduce thermal loss from the temperature controlled chamber 110. In some embodiments, the capillary tubes 130 may be coupled to additional substrate materials through pin contacts 140. Furthermore, in some embodiments, the temperature controlled chamber 110 may be disposed within a second chamber 120. The second chamber 120 may be an evacuated chamber to reduce losses due to air convection and conduction heat loss.

Figure 2:
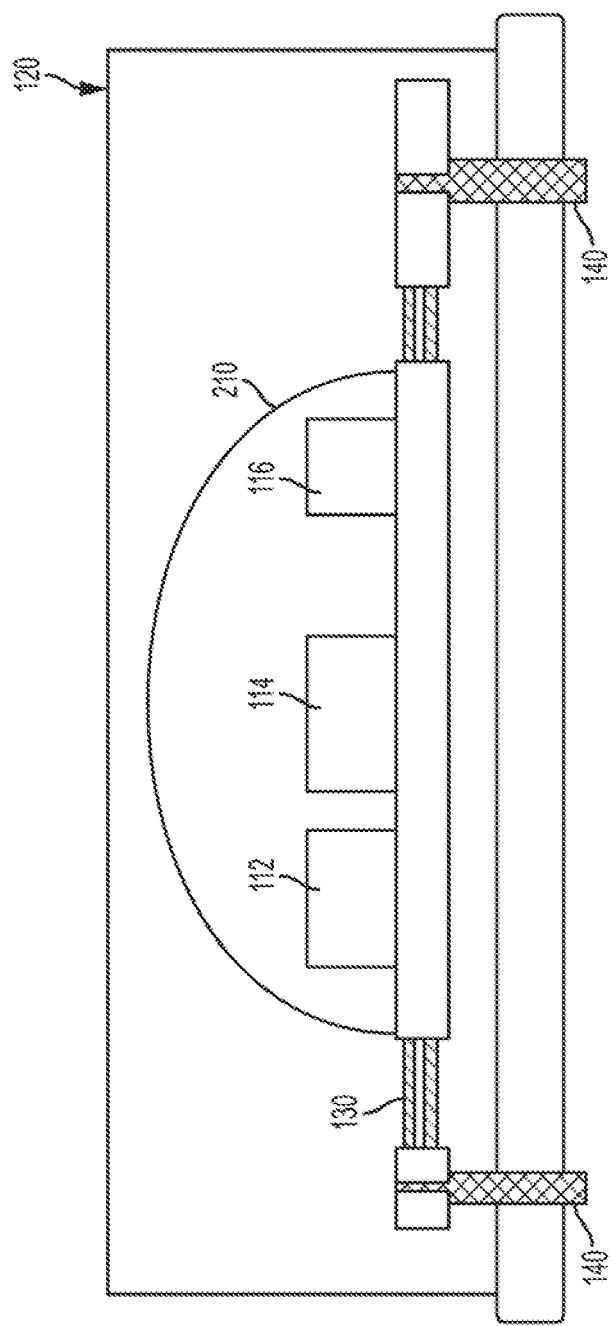
FIG. 2 is a diagram showing an apparatus including a temperature controlled chamber supported by capillary tubes, according to some embodiments.

In some embodiments, as shown in FIG. 2, rather than a low pressure evacuated chamber 110 as shown in FIG. 1, a solid material may be used to provide a consistent temperature to a temperature controlled element. Either the solid fill as shown in FIG. 2 or the temperature controlled chamber as shown in FIG. 1 may be coated in a low emissive material to reduce thermal radiation loss from the temperature controlled chamber.

In FIG. 1 and FIG. 2, the capillary tubes 130 may be coupled to the temperature controlled chamber 130. Additionally, the temperature controlled chamber 110 or 210 may be coupled to an additional substrate structure to external pins 140. In some embodiments, in addition to the structures described, the temperature controlled chamber 110 or 210 may be of a different structure or form. In addition, the heater 116 shown in FIG. 1 or 2 may be disposed in a different position. For example, the heater 116 may be outside temperature controlled chamber 110 or 210. Furthermore, in some embodiments, additional electronics may be disposed within or outside temperature controlled chamber 110 or 210.

Figure 3A:
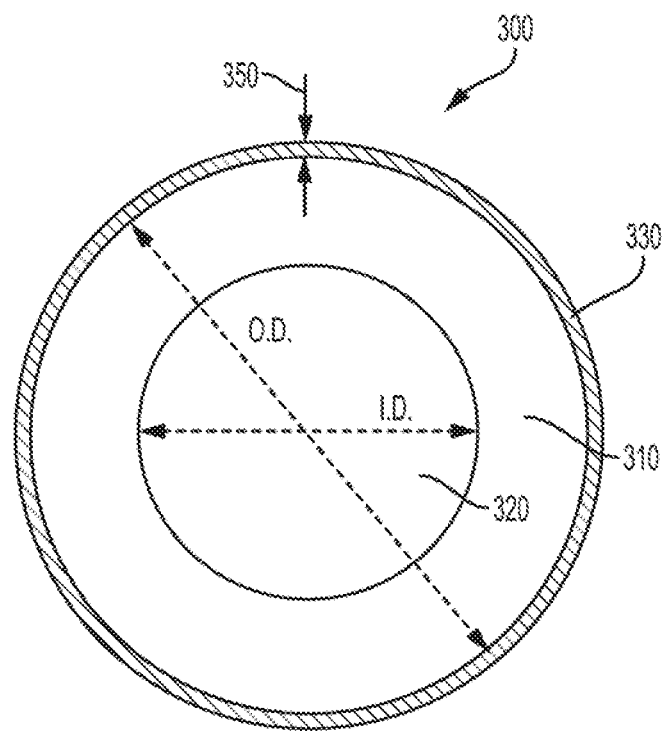
FIG. 3A is a diagram showing a cross-section of a capillary tube, according to some embodiments.
Figure 3B:
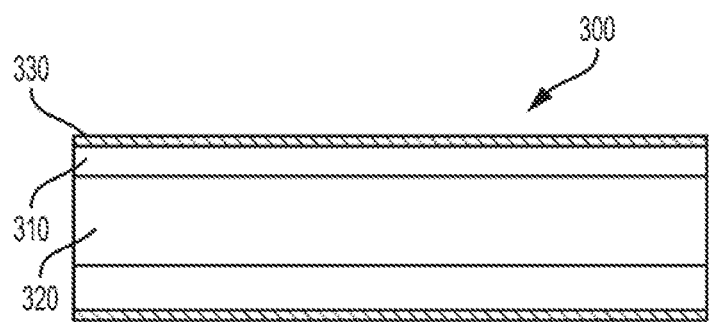
FIG. 3B is a diagram showing a cross-section of a capillary tube, according to some embodiments.

FIGS. 3A and 3B depict an example capillary tube 300 as described with reference to FIGS. 1 and 2. FIG. 3A shows a cross-sectional view of the capillary tube 300 perpendicular to a longitudinal axis of the capillary tube 300. FIG. 3B shows a cross-sectional view of the capillary tube 300 along the longitudinal axis. In FIGS. 3A and 3B the capillary tube 300 includes a fiber body material 310 a core 320, and a strengthening coating 330.

In some embodiments, the fiber body material 310 may have an inner diameter in a range of about hundreds of microns. An outer diameter of the fiber body material 310 may be in a range of about tens of microns to about hundreds of microns. Thus a body thickness of the fiber body material 310 may be in a range of about tens of microns to about hundreds of microns. In some embodiments, the fiber body material 310 may be made of materials having low thermal conductive properties to improve thermal insulation of the temperature controlled camber. For example, in some embodiments, the fiber body material 310 may be one of silica, ceramic, or a polymer material. In some embodiments, the fiber body material 310 may have no inner diameter and there may be no core 320.

In some embodiments the core 320 may be a hollow space within the fiber body material 310. In some embodiments, the core 320 may be a material with low thermal conductivity properties. For example, the core may be silica, ceramic, or a polymer material. While FIGS. 3A and 3B show a fiber body material 310 and a core 320, in some embodiments, there may be additional layers within a capillary tube 300. For instance, there may be multiple layers within core 320. In some embodiments, there may be multiple layers of the fiber body material 310 with a hollow core 320.

The strengthening coating 330 may improve the structural properties of the capillary tube 300. A fiber body material 310 with a core 320 may provide sufficient thermal insulation properties to improve the operation of a temperature controlled chamber as described with reference to FIGS. 1 and 2. However, to provide additional structural support or durability, a strengthening coating 330 may improve the properties of the capillary tube 300. In some embodiments, the strengthening coating 330 may be a polymeric coating. For example, strengthening coating materials may include polyimide, polyamide, parylene, PDMS, or the like. In some embodiments, the strengthening coating 330 may be another material including non-polymeric materials. In some embodiments, the thickness 350 of the strengthening coating may be about tens of nanometers to about tens of micrometers.

While FIGS. 3A and 3B show a cylindrical capillary tube 300, in some embodiments, the capillary tube may be a different shape. For instance, the capillary tube 300 may be rectangular, ovular, polygonal, or any other profile. In addition, different sections of capillary tube 300 may have different thicknesses for one or more component. Furthermore, in some embodiments, there may be fewer or additional layers for capillary tube 300 than are shown in FIGS. 3A and 3B.

Figure 4A:
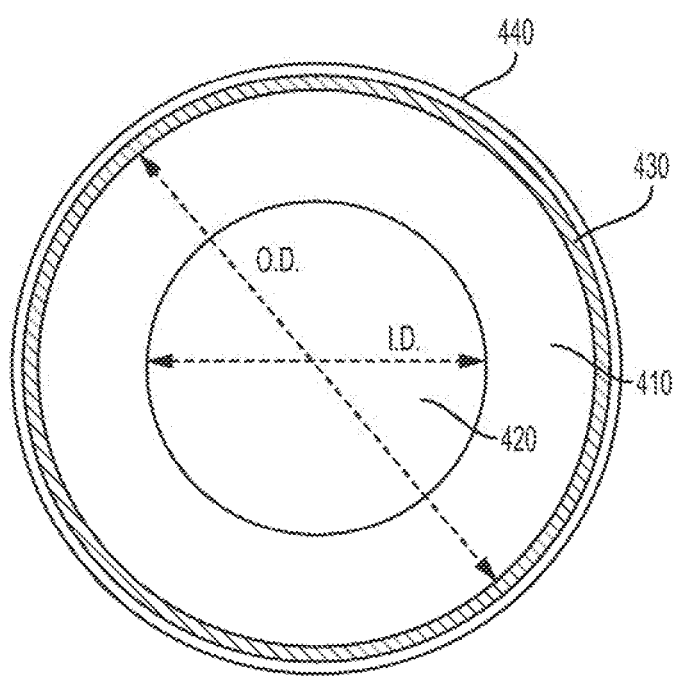
FIG. 4A is a diagram showing a cross-section of a capillary tube with an electrically conductive coating, according to some embodiments.
Figure 4B:
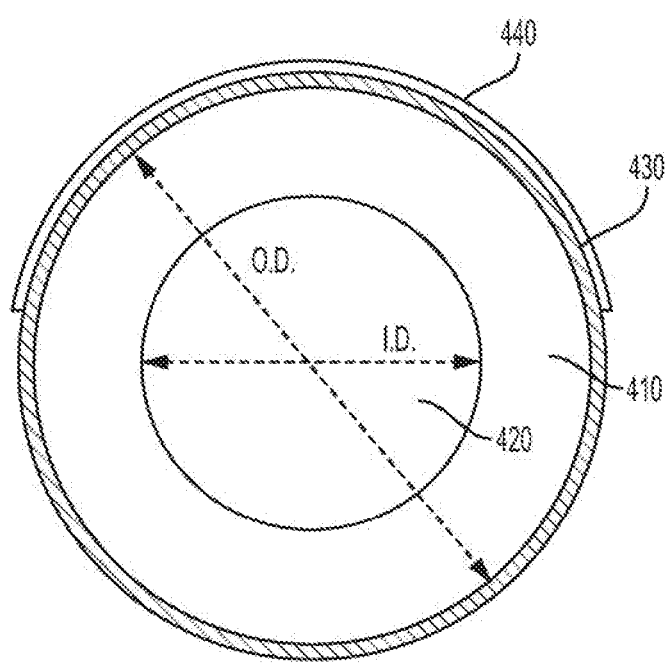
FIG. 4B is a diagram showing a cross-section of a capillary tube with an electrically conductive coating, according to some embodiments.
Figure 4C:
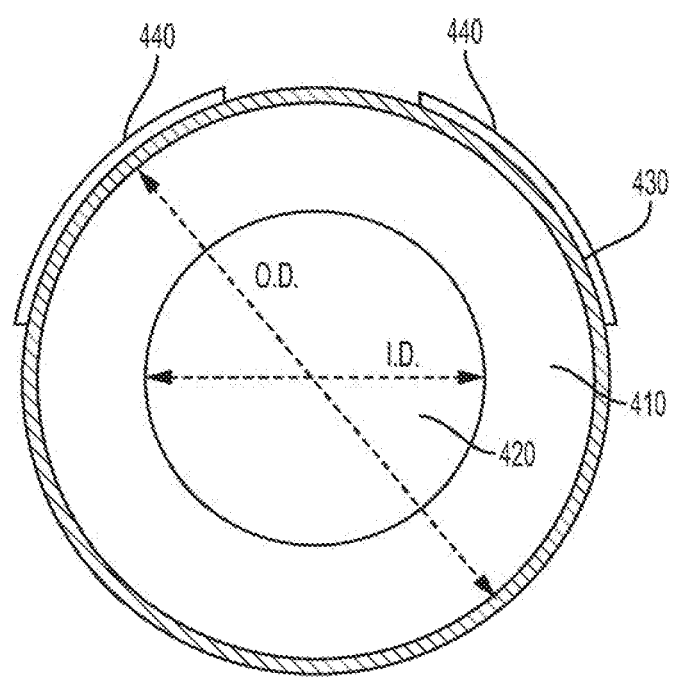
FIG. 4C is a diagram showing a cross-section of a capillary tube with an electrically conductive coating, according to some embodiments.

FIGS. 4A, 4B, and 4C depict example embodiments of a capillary tube 400 having an electrical conductive layer 440. In some embodiments, the capillary tube 400 may be the same or similar to the capillary tubes 300 as described with reference 3A and 3B with an additional electrically conductive layer 440. For example, the capillary tube 400 may have a fiber body 410, a core 420, and a strengthening coating 430 as described with reference to FIGS. 3A and 3B.

As described above, the electrically conductive layer 440 may be used to electrically couple a temperature controlled chamber to external circuits. For example, the electrically conductive layer 440 may be coupled to the temperature controlled chamber on one end and to a pin to external circuitry on an opposite end. In some embodiments, the electrically conductive layer 440 may be a thin film applied to the outside of the capillary tubes. For example, the film materials may include copper, gold, silver, conductive epoxy, Indium Tin Oxide, titanium, nickel, or other electrically conductive materials. In some embodiments, there are plural numbers of the thin film layers with at least one layer of electrically conductive materials and other layers for adhesion, protection or other ancillary reasons to provide additional properties to electrically conductive layer 440.

In some embodiments, the electrically conductive layer 440 may have a thickness in a range of about tens of nanometers to about then micrometers. In some embodiments, the coating method of the electrical conductive materials include but not limited to evaporation, sputtering, atomic layer deposition (ALD), Chemical vapor deposition (CVD), spray coating and aerosol jet printing. In some embodiments, the electrically conductive layer 440 may be continuous and totally cover the capillary tube as shown in FIG. 4A. For example, the capillary tube 400 may be rotated during a deposition process to cover all sides of the capillary tube 400. In some embodiments, the electrically conductive layer 440 may be continuous and partially cover the capillary tube as shown in FIG. 4B. For example, during a directional deposition process, the capillary tube may be coated continuously on one side. In some embodiments, the electrically conductive layer 440 may not be continuous and partially cover the capillary tube as shown in FIG. 4C. For example, using aerosol jet printing, the capillary tube 400 may coated to provide two traces from the temperature controlled chamber to external circuitry. Accordingly, in some embodiments, the capillary tube 400 may carry multiple signals to or from the temperature controlled chamber. Furthermore, in some embodiments, the electrically conductive layer 440 may cover an entire length of a capillary tube 400. In some embodiments, the electrically conductive layer 440 may cover portions of a length of a capillary tube 400. For example, different portions of a length of capillary tube 400 may have discontinuous electrically conductive layers 440.

Figure 5:
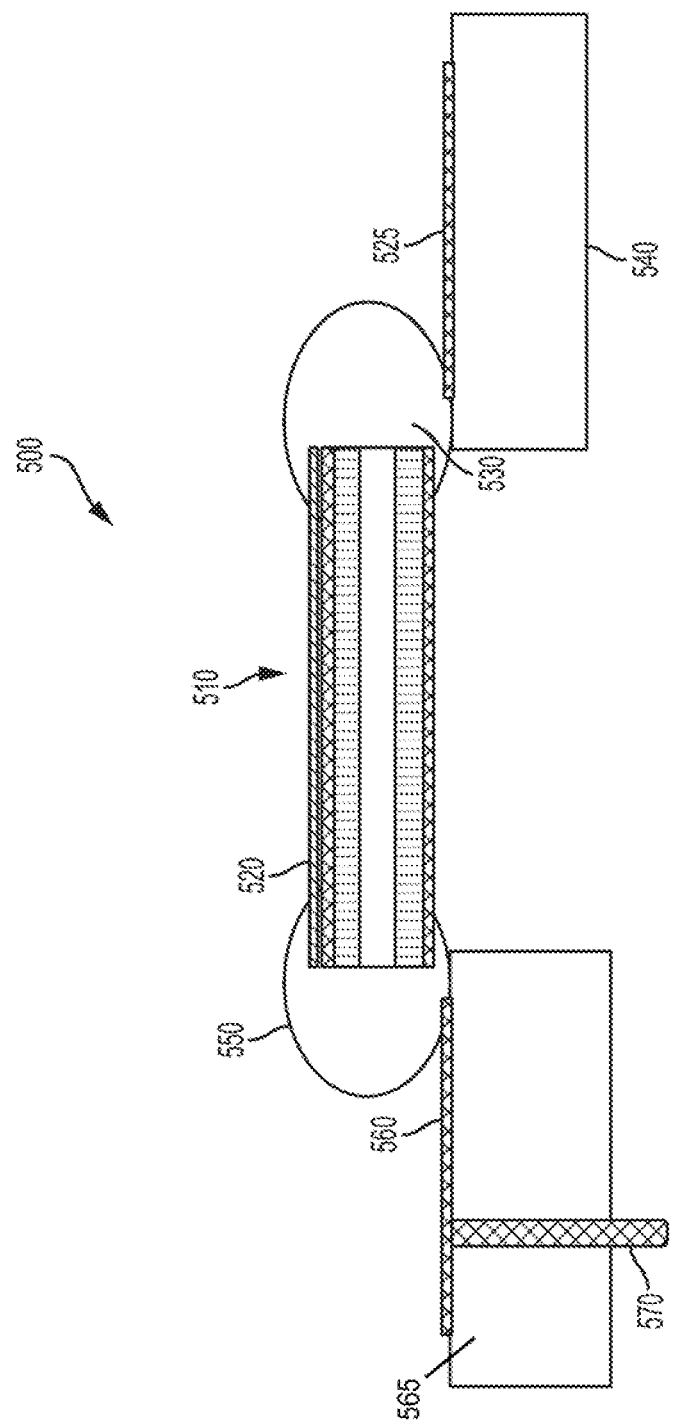
FIG. 5 is a diagram showing an apparatus having a capillary tube connecting a temperature controlled chamber to external components, according to some embodiments.

FIG. 5 depicts an example of system 500 with a capillary tube 510 connecting temperature controlled chamber to external components. The capillary tube 510 may have a structure similar or the same to those described in reference to FIGS. 3A, 3B, and 4A-4C. To provide an electrical connection, the capillary tube 510 may have an electrically conductive layer 520.

The capillary tube 510 may be coupled to a substrate 540 supporting the temperature controlled chamber with a silver epoxy or solder 530. The silver epoxy or solder 530 may couple the electrically conductive layer 520 to a metal trace 525 on the substrate 540. The other end of capillary tube 510 may be similarly coupled to an external structure, such as substrate 565, that is part of the shell of the device. In some embodiments, silver epoxy of solder 550 may couple the electrically conductive layer 520 to a metal trace 560 of the shell. In some embodiments, substrate 565 may include a pin 570 to couple the chamber to external electronics. Accordingly, an electrical connection may be formed from a temperature controlled device to external electronics. In some embodiments, other structures may be used to couple the capillary tube 520 to external electronics. Furthermore, additional bonding may be provided for mechanical support in addition to the silver epoxy or solder 530. In some embodiments, other materials may be used to form an electrical connection between the capillary tube 510, the substrate 540 and the substrate 565.

Figure 6:
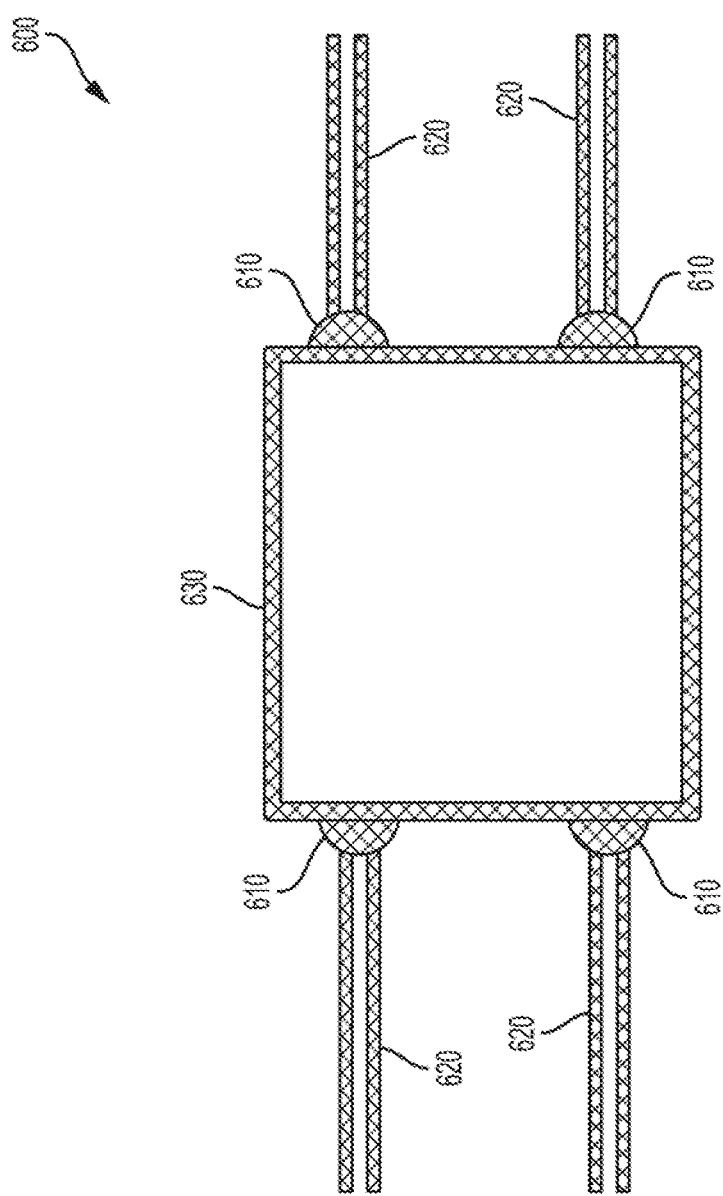
FIG. 6 is a diagram showing an apparatus having a temperature controlled chamber coupled to capillary tubes, according to some embodiments.

FIG. 6 depicts an example apparatus 600 of a temperature controlled chamber 630 coupled to capillary tubes 620 through connection points 610. The capillary tubes 620 may have a structure similar or the same to those described in reference to FIGS. 3A, 3B, and 4A-4C. In some embodiments, to provide an electrical connection, one or more of the capillary tubes 620 may have an electrically conductive layer. For example, all of the capillary tubes 620 may have an electrically conductive layer, a subset of the capillary tubes 620 may have an electrically conductive layer, or none of the capillary tubes 620 may have an electrically conductive layer.

While the apparatus shown in FIG. 6 includes four capillary tubes 620, in some embodiments there may be fewer or additional capillary tubes 620. In addition, the capillary tubes 620 may have a different arrangement or may be connected at different connection points. For example, there may be capillary tubes 620 attached to all sides of the temperature controlled chamber, capillary tubes 620 attached to the corners of the temperature controlled chamber, or attached at other angles than shown. In addition, in some embodiments, the temperature controlled chamber may not be rectangular, but may be another shape.

In some embodiments, the capillary tubes 620 may be mechanically or electrically coupled to the temperature controlled chamber 630, through connection points 610. In some embodiments, different connection points 610 may have different bonding materials depending on whether the connection point is providing an electrical connection between the capillary tubes 620 and the temperature controlled chamber 630. For example, a subset of connection points 610 may be have bonding materials including a silver epoxy or solder while other bonding materials may be a polymer. In some embodiments, one or more of the connection points 610 may be polymer, epoxy, glue, solder, silica, or the like. In some embodiments, the capillary tubes 620 may be coupled to the temperature controlled chamber 630 using multiple materials or layers of materials.

Figure 7:
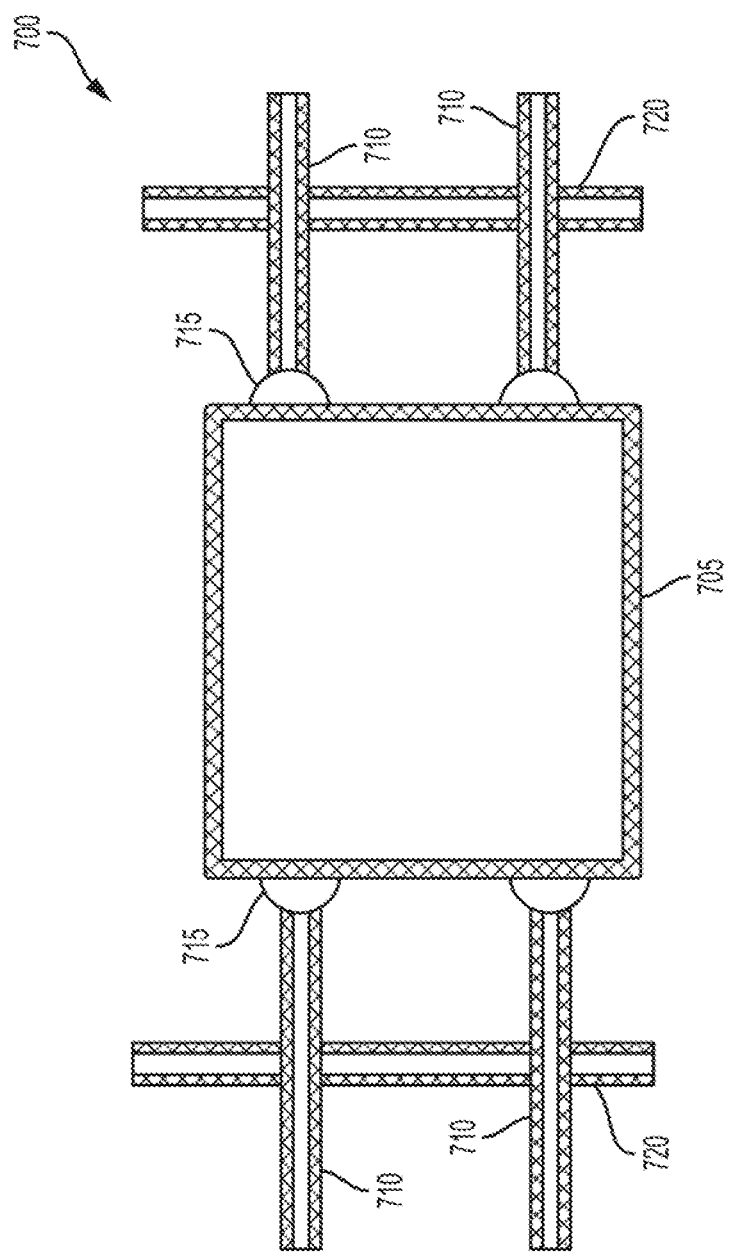
FIG. 7 is a diagram showing an apparatus having a temperature controlled chamber coupled to capillary tubes, according to some embodiments.

FIG. 7 depicts an example apparatus 700 of a temperature controlled chamber 705 coupled to capillary tubes 710 through connection points 715. In addition, the example apparatus 700 may include supplemental capillary tubes 720. The capillary tubes 710 and supplemental capillary tubes 720 may have a structure similar or the same to those described in reference to FIGS. 3A, 3B, and 4A-4C. In some embodiments, to provide an electrical connection, one or more of the capillary tubes 710 may have an electrically conductive layer. In some embodiments, all of the capillary tubes 710 may have an electrically conductive layer, a subset of the capillary tubes 710 may have an electrically conductive layer, or none of the capillary tubes 710 may have an electrically conductive layer. In some embodiments, the supplemental capillary tubes 720 may not have an electrically conductive layer as the supplemental capillary tubes 720 are not coupled to the temperature controlled chamber 705.

In some embodiments, the supplemental capillary tubes 720 may be coupled to the capillary tubes 710 through point contacts. For instance, the capillary tubes 710 may rest on the supplemental capillary tubes 720. Accordingly, while providing support and additional durability, the supplemental capillary tubes 720 may have a minimal amount of contact with the capillary tubes 710. The minimal contact may further reduce thermal loss through supplemental capillary tubes 720.

Figure 8:
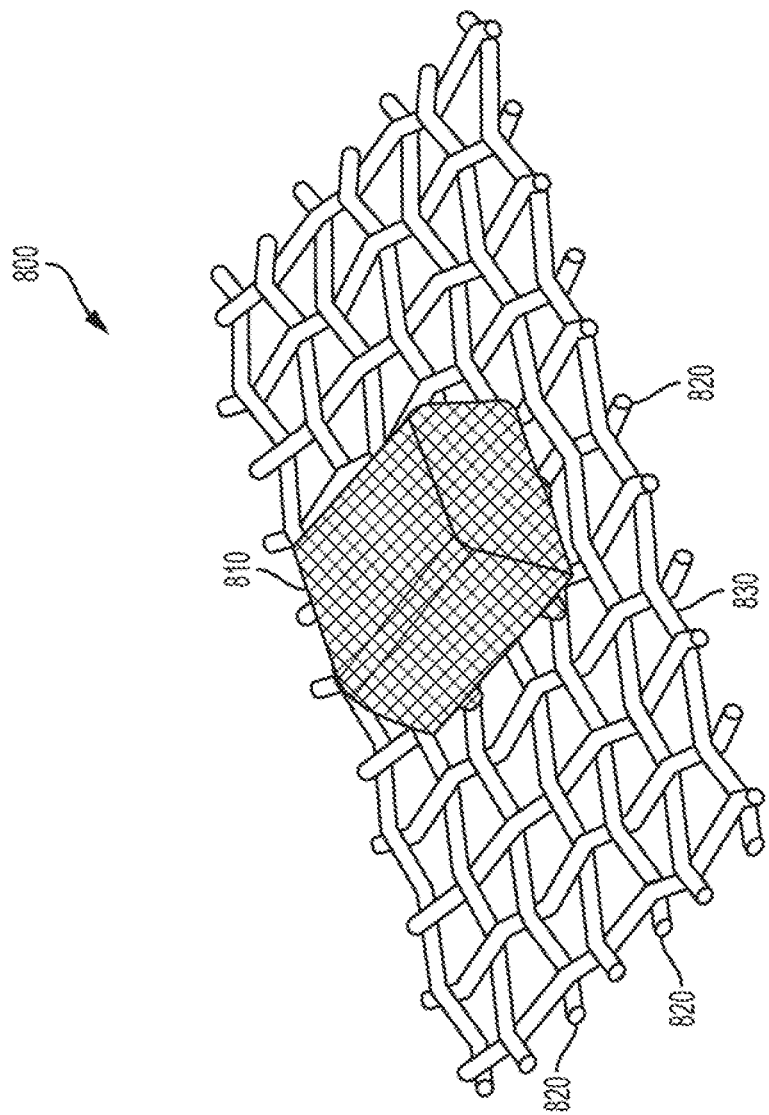
FIG. 8 is a diagram showing an apparatus having a temperature controlled chamber coupled to capillary tubes, according to some embodiments.

In some embodiments, there may be additional capillary tubes. For example, FIG. 8 depicts an example apparatus 800 of a temperature controlled chamber 810 coupled to capillary tubes 820 through connection points 830 and having additional supplemental capillary tubes 830. The capillary tubes 820 and supplemental capillary tubes 830 may be constructed to form a mesh. In some embodiments, the mesh may provide additional mechanical support and durability while maintaining point contact between the capillary tubes 820 and the supplemental capillary tubes 830. In some embodiments, the apparatus 800 may have a different number of connection points 830, capillary tubes 820, supplemental capillary tubes 830 or different temperature controlled chambers 810.

FIGS. 9A through 9G depict components of an OCXO during parts of manufacturing processes. In some embodiments, the processes of manufacturing the OCXO may involve fewer or additional steps. Furthermore, the process as shown in FIGS. 9A through 9G may be performed in a different order. While the processes are shown for an OCXO, having different electronics in the temperature controlled chamber would provide other types of devices in a temperature controlled chamber and thermally isolated from external components. For example, capillary tubes may be used to provide thermal isolation for components that are kept at a cooled state relative to other components. Furthermore, in some embodiments, the capillary tubes may be used to provide thermal isolation between components that are not temperature controlled.

Figure 9A:
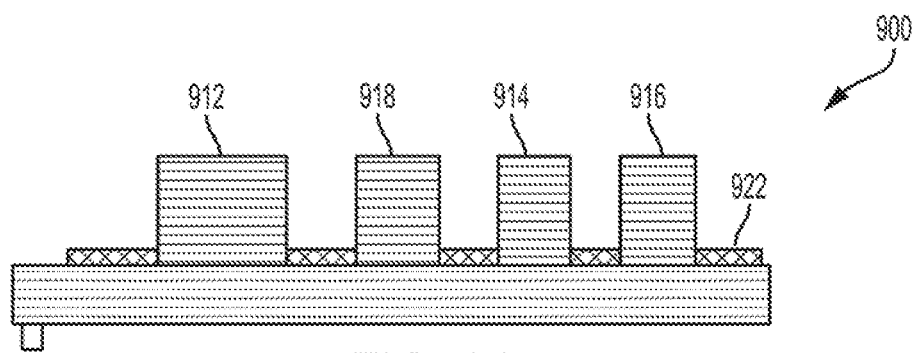
FIG. 9A depicts components of an oven-controlled crystal oscillator during part of a manufacturing process, according to some embodiments.

Beginning in FIG. 9A, the electronics of the temperature controlled device 900 are assembled on a substrate. For example, an OCXO may include a crystal resonator 912, a temperature sensor 914, a heater 916, and potentially additional electronics 918. In some embodiments, a temperature controlled device 900 may include fewer or additional components than those shown. In addition, other temperature controlled devices 900 may include different components depending on the application. In some embodiments, the components may be assembled on a substrate such as a silicon wafer, or other substrates. In some embodiments, the electronics may be assembled on other structures. In addition to the electronics, in some embodiments, metal or other electronically conductive traces 922 may be applied to the substrates to provide electrical connections from the substrate. For example, metal traces may be used to attach to capillary tubes.

Figure 9B:
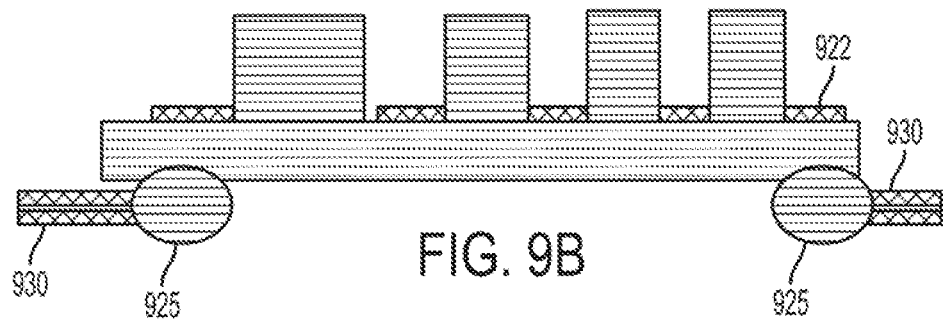
FIG. 9B is a diagram showing components of an oven-controlled crystal oscillator during part of a manufacturing process, according to some embodiments.
Figure 9C:
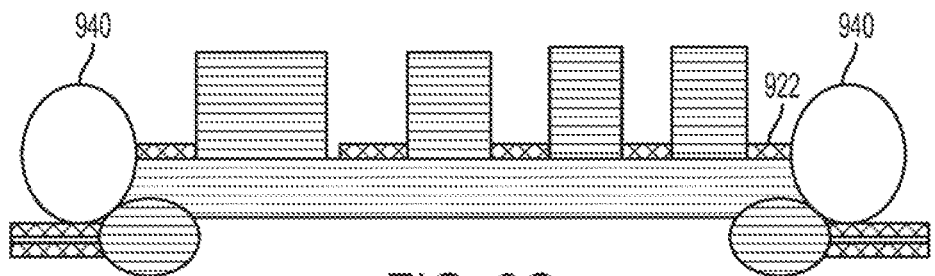
FIG. 9C is a diagram showing components of an oven-controlled crystal oscillator during part of a manufacturing process, according to some embodiments.

In FIG. 9B, capillary tubes 930 may be attached to the substrate using epoxy or another bonding material 925. The Attach the fibers (fibers are metalized) to the substrate using epoxy. For example, the epoxy may be a polymer based bonding material. In FIG. 9C, the capillary tubes may be coupled electronically to metal traces 922. For example a silver epoxy, solder, or other electrically conductive bonding material 925 may be used to electronically couple metal traces 922 to the capillary tubes 930.

Figure 9D:
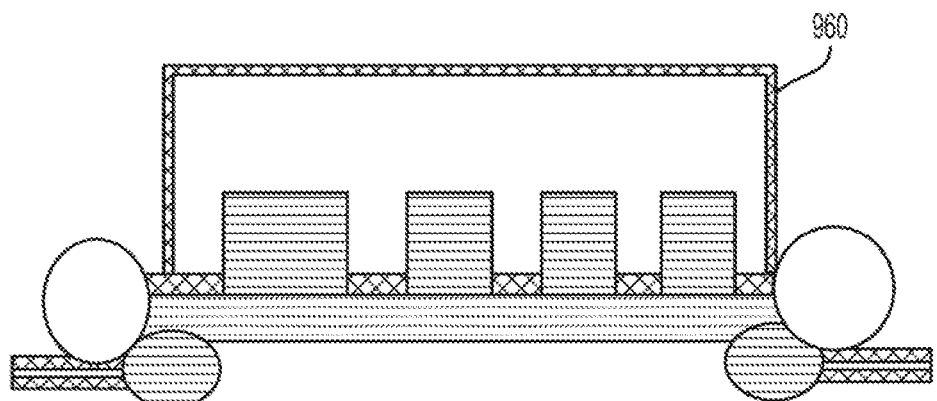
FIG. 9D is a diagram showing components of an oven-controlled crystal oscillator during part of a manufacturing process, according to some embodiments.
Figure 9E:
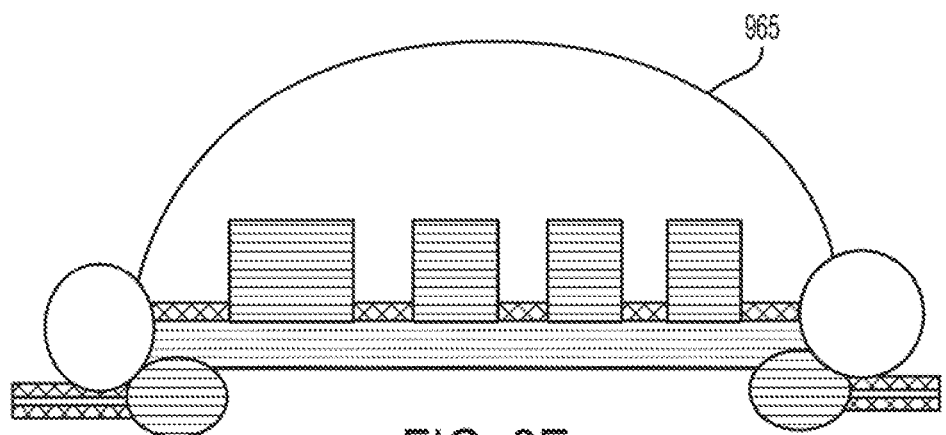
FIG. 9E is a diagram showing components of an oven-controlled crystal oscillator during part of a manufacturing process, according to some embodiments.

In FIG. 9D, a temperature controlled chamber 960 may be hermetically sealed around the assembled electronics. In some embodiments, the temperature controlled chamber 960 may be filled with a gas and sealed to prevent the gas from leaking. FIG. 9E shows an alternative embodiment wherein the electronic components are sealed within a solid material such as an epoxy, polymer, or other solid fill. In either of the embodiments shown in FIG. 9D or 9E, may be coated with a low emission material to reduce radiation losses. For example, the temperature controlled chamber 960 may be coated with a metal 965 such as gold, copper, aluminum, a polymer, or another low radiation material.

Figure 9F:
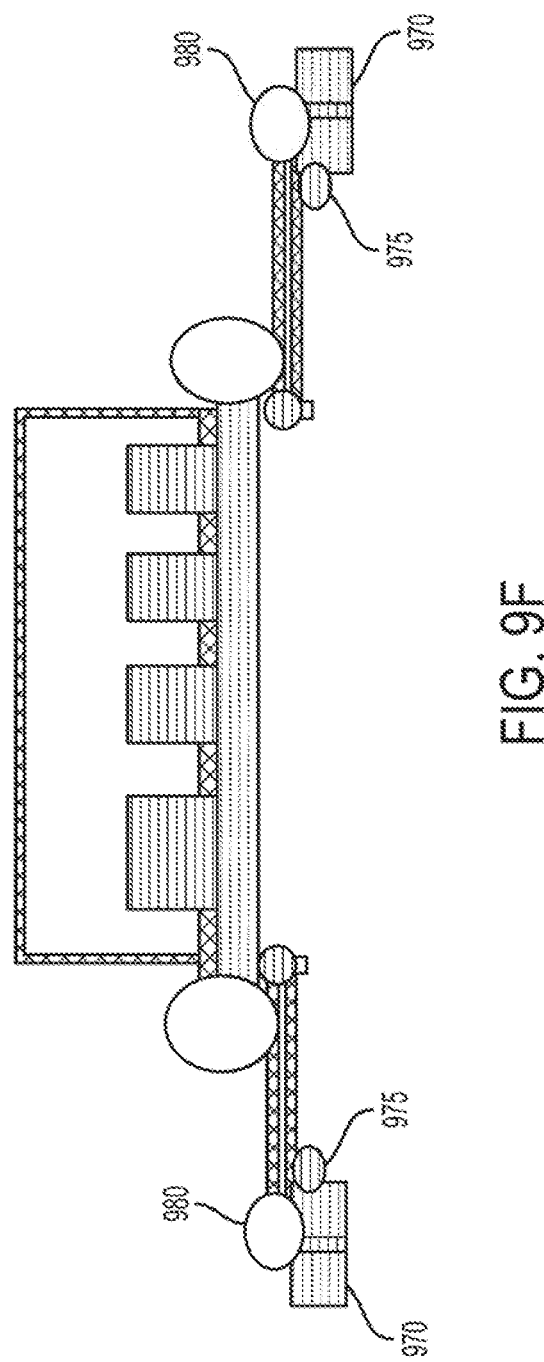
FIG. 9F is a diagram showing components of an oven-controlled crystal oscillator during part of a manufacturing process, according to some embodiments.

In FIG. 9F, the capillary tubes 930 are attached to a substrate 970 to electronically couple the temperature controlled device 900 to external components. For example, the capillary tubes 930 may be coupled through bonding materials 980 and electrically conductive bonding materials 975 similar or the same as the bonding materials used to bind the capillary tubes 930 to the substrate 920 and metal traces 922 as described with reference to FIGS. 9B and 9C.

Figure 9G:
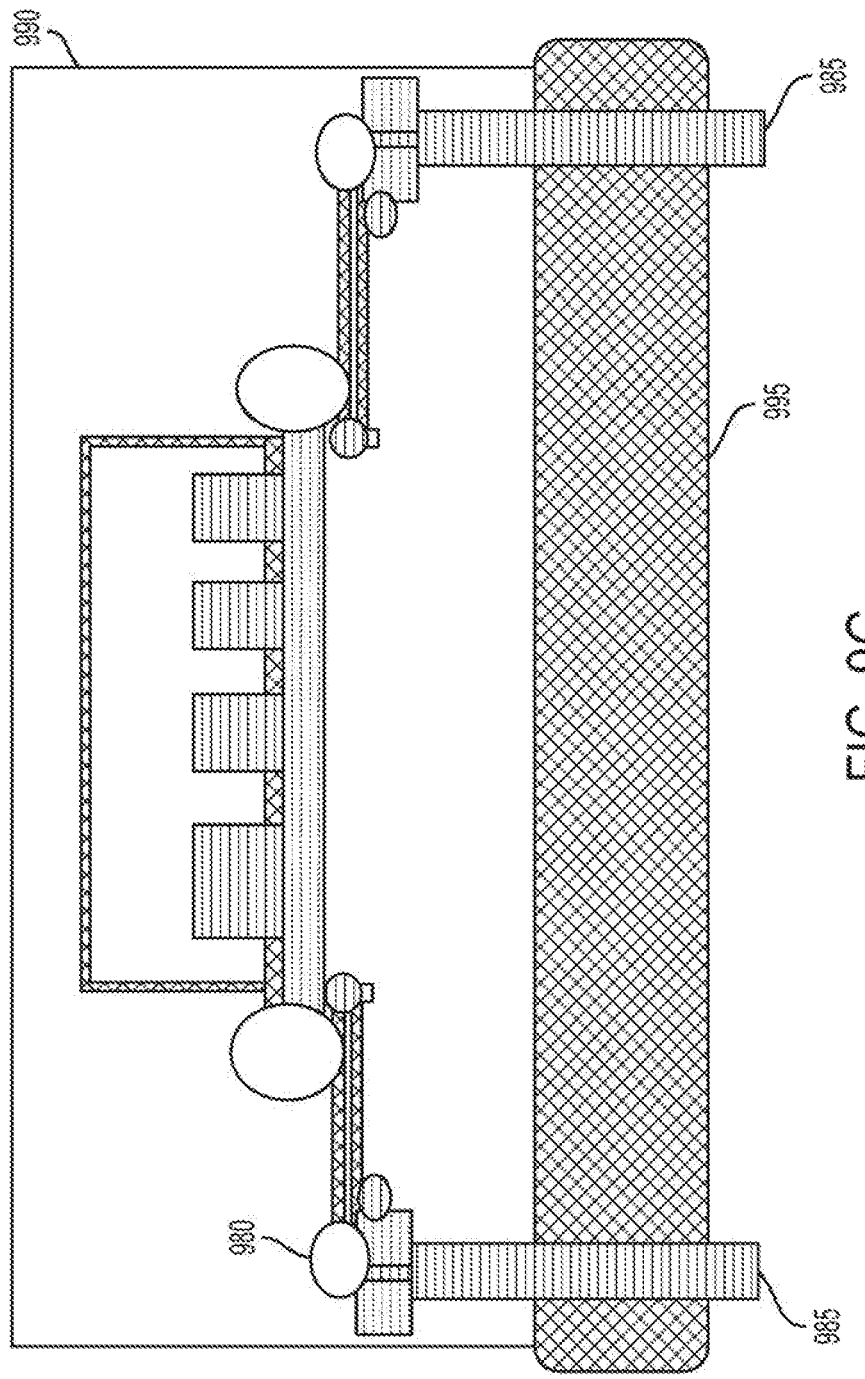
FIG. 9G is a diagram showing components of an oven-controlled crystal oscillator during part of a manufacturing process, according to some embodiments.

In FIG. 9G, the temperature controlled chamber 960 may be vacuum sealed within a vacuum package 990. For example, the vacuum package may reduce thermal losses due to convection outside of the temperature controlled device 900. In some embodiments, instead of vacuum sealing the temperature controlled chamber 960 within a vacuum package 990, the temperature controlled chamber 960 may be sealed in a gas filled chamber. For instance, the outer chamber 990 may be filled Argon or another gas having low thermal conductivity. In addition, pins 985 may be provided through a shell composed of a substrate 995 and the vacuum package 990. Accordingly, the temperature controlled device 900 may be sealed within a temperature controlled chamber 960, and connected to external electronics through a shell.

Figure 10:
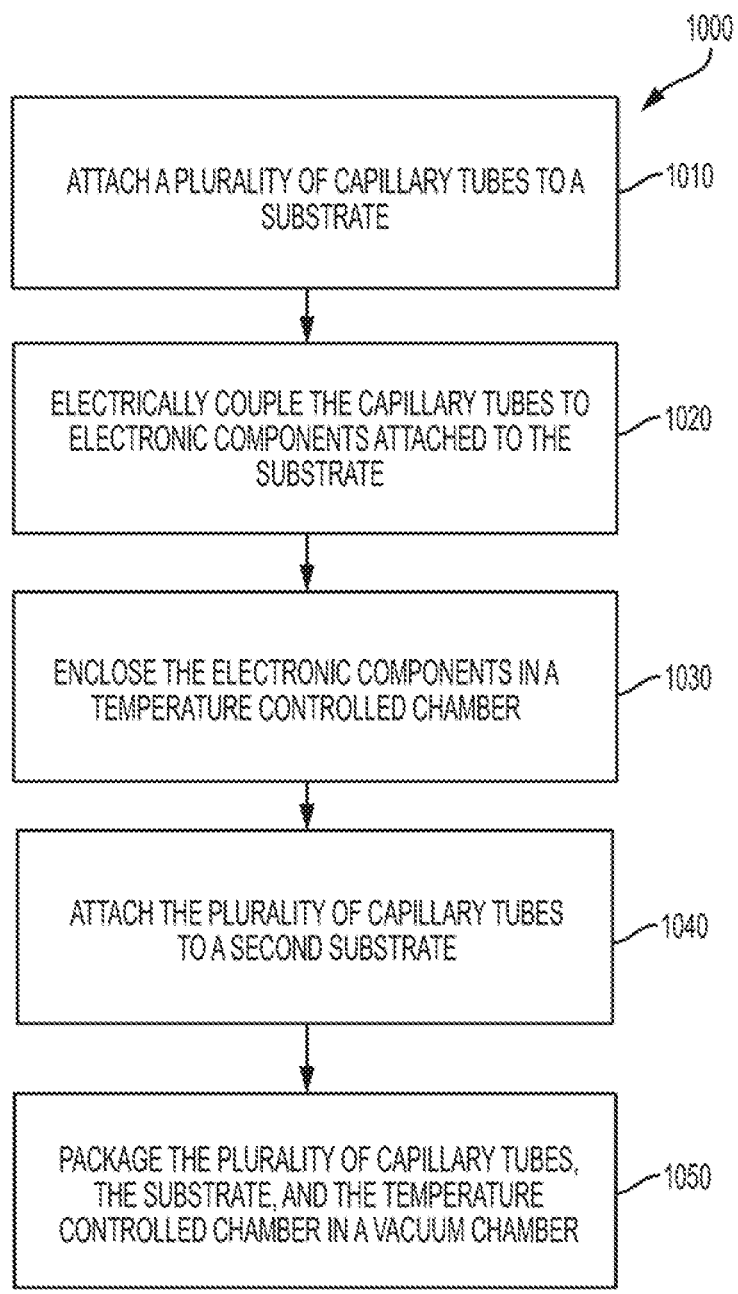
FIG. 10 is a flow diagram showing a method of manufacturing a temperature controlled component with capillary tubes for thermal management, according to some embodiments.

FIG. 10 depicts a flow diagram 1010 of an example process of manufacturing a temperature controlled device with capillary tubes for thermal management. Beginning in block 1000, a plurality of capillary tubes is attached to a substrate. For example, the capillary tubes may be similar to those described with reference to the preceding Figures. In some embodiments, the capillary tubes may be attached with a bonding material such as a polymer, epoxy, glue, solder, silica, or the like.

Moving to block 1020 the capillary tubes are electronically coupled to electronic components attached to the substrate. For example, an electronically conductive coating of the capillary tubes may be coupled to metal traces on the substrate. In some embodiments, conductive materials are used as the connecting materials for electrical conducting coating. For example, conductive bonding materials may include silver epoxy or solder. In some embodiments, the connecting joint can have more than one material.

In block 1030, the electronic components may be enclosed in a temperature controlled chamber. For example, the electronic components may be enclosed in a chamber such as shown in FIG. 9D or temperature controlled chamber 110 as described with reference to FIG. 1.

In block 1040 the plurality of capillary tubes are attached to a second substrate. For example, the second substrate may have pins to electronically couple the temperature controlled components to external electrical components. For example, the second substrate may have metal traces or other electronic components that are attached to the capillary tubes.

In block 1050, the plurality of capillary tubes, the temperature controlled chamber and the substrates may be vacuum sealed in a second chamber. For example, the second chamber may be as described with reference to component 990 of FIG. 9G or 120 with reference to FIG. 1.

Various operations are described as multiple discrete operations, in turn, in a manner that is most helpful in understanding the present disclosure, however, the order of description may not be construed to imply that these operations are necessarily order dependent. In particular, these operations need not be performed in the order of presentation.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular embodiments may vary from these exemplary details and still be contemplated to be within the scope of the present disclosure.

Additionally, some embodiments may be practiced in distributed computing environments where the machine-readable medium is stored on and or executed by more than one computer system. In addition, the information transferred between computer systems may either be pulled or pushed across the communication medium connecting the computer systems.

Embodiments of the claimed subject matter include, but are not limited to, various operations described herein.

These operations may be performed by hardware components, software, firmware, or a combination thereof.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent or alternating manner.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Furthermore, the terms "first," "second," "third," "fourth," etc. as used herein are meant as labels to distinguish among different elements and may not necessarily have an ordinal meaning according to their numerical designation.

It will be appreciated that variants of the above-disclosed and other features and functions, or alternatives thereof, may be combined into may other different systems or applications. Various presently unforeseen or unanticipated alternatives, modifications, variations, or improvements therein may be subsequently made by those skilled in the art which are also intended to be encompassed by the following claims. The claims may encompass embodiments in hardware, software, or a combination thereof.

What is claimed is:

1. A method of manufacturing an electronic device, comprising:
enclosing electronic components in a temperature controlled chamber, wherein enclosing the electronic components in the temperature controlled chamber comprises hermetically sealing the temperature controlled chamber;
packaging a plurality of capillary tubes, a substrate, and the temperature controlled chamber in a vacuum chamber;
providing an outer shell having a low pressure chamber to house the temperature controlled chamber; and
providing a second set of capillary tubes to support the plurality of capillary tubes attached to the substrate.

2. The method of claim 1, further comprising coating the temperature controlled chamber in a low emissive material.

3. The method of claim 1, wherein packaging the plurality of capillary tubes and the substrate comprises attaching the plurality of capillary tubes to the substrate using epoxy.

4. An oven-controlled crystal oscillator comprising:
a temperature controlled chamber disposed within a vacuum packaged assembly;
a crystal oscillator disposed within the temperature controlled chamber, wherein the temperature controlled chamber is a solid material housing the crystal oscillator and a temperature sensor; and
an outer shell having a low pressure chamber to house the temperature controlled chamber.

5. The oven-controlled crystal oscillator of claim 4, further comprising:
a plurality of capillary tubes electrically coupled to the crystal oscillator, wherein:
a first end of each of the plurality of capillary tubes is coupled to the temperature controlled chamber; and
a second end of each of the plurality of capillary tubes is coupled to a support structure.

6. The oven-controlled crystal oscillator of claim 5, wherein the low pressure chamber also houses the plurality of capillary tubes.

7. The oven-controlled crystal oscillator of claim 5, further comprising: a second plurality of capillary tubes having a hollow core and a polymer coating, wherein the second plurality of capillary tubes is not coupled to the temperature controlled chamber.

8. The oven-controlled crystal oscillator of claim 7, wherein the plurality of capillary tubes and the second plurality of capillary tubes form a mesh to support the temperature controlled chamber.

9. The oven-controlled crystal oscillator of claim 5, wherein the plurality of capillary tubes is electrically coupled to the crystal oscillator through an electrically conductive layer of the plurality of capillary tubes.

10. The oven-controlled crystal oscillator of claim 4, further comprising an external structure operatively coupled with the temperature controlled chamber.

* * * * *